United States Patent
Beer et al.

(10) Patent No.: US 6,897,411 B2
(45) Date of Patent: May 24, 2005

(54) HEATED SUBSTRATE SUPPORT

(75) Inventors: Emanuel Beer, San Jose, CA (US);
Makoto Inagawa, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 143 days.

(21) Appl. No.: 10/074,856

(22) Filed: Feb. 11, 2002

(65) Prior Publication Data

US 2003/0150849 A1 Aug. 14, 2003

(51) Int. Cl.[7] ............................. F27B 5/14
(52) U.S. Cl. ............... 219/390; 219/405; 219/411; 118/724; 118/725; 118/50.1; 392/416; 392/418
(58) Field of Search ................ 219/390, 405, 219/411, 392, 402, 521, 544; 118/724, 725, 50.1, 500; 392/416, 418

(56) References Cited

U.S. PATENT DOCUMENTS

| | | | |
|---|---|---|---|
| 5,151,871 A | 9/1992 | Matsumura et al. | 364/557 |
| 5,595,241 A | 1/1997 | Jelinek | 165/80.1 |
| 5,716,207 A | 2/1998 | Mishina et al. | 432/253 |
| 5,844,205 A | 12/1998 | White et al. | 219/390 |
| 5,850,071 A * | 12/1998 | Makiguchi et al. | 219/390 |
| 5,884,009 A | 3/1999 | Okase | 392/418 |
| 6,035,101 A | 3/2000 | Sajoto et al. | 392/416 |
| 6,054,688 A | 4/2000 | Moschini | 219/494 |
| 6,062,852 A | 5/2000 | Kawamoto et al. | 432/258 |
| 6,087,632 A | 7/2000 | Mizosaki et al. | 219/390 |
| 6,147,334 A * | 11/2000 | Hannigan | 219/544 |
| 6,221,437 B1 | 4/2001 | Reynolds | 427/430.1 |
| 6,276,072 B1 | 8/2001 | Morad et al. | 34/428 |

OTHER PUBLICATIONS

White, et al., "Substrate Support", U.S. patent application, Ser. No. 09/982,406, filed Oct. 17, 2001.
Shang, et al., "Chamber for Uniform Substrate Heating", U.S. patent application, Ser. No. 10/025,152, filed Dec. 18, 2001.
Copy of International Search Report dated Aug. 4, 2003 from corresponding PCT application, PCT/US03/02735.

* cited by examiner

Primary Examiner—Shawntina Fuqua
(74) Attorney, Agent, or Firm—Moser, Patterson & Sheridan LLP (57) ABSTRACT

A heated substrate support and method for making the same is generally provided. In one embodiment, a heated support includes a first and second plates having a heating element disposed therebetween. The heating element is biased against the first plate to provide good heat transfer therewith. In another embodiment, a heated support includes a first metallic plate coupled to a second metallic plate and sandwiching at least one guide therebetween. A resistive heating element is laterally retained by the guide relative to the first plate. In another aspect of the invention, a heating chamber for heating a substrate is provided. In one embodiment, the heating chamber includes walls defining an interior volume and a plurality of heated support plates coupled to the walls. The support plates are generally stacked parallel to each other within the interior volume. A heating element is urged against each first support plate.

11 Claims, 9 Drawing Sheets

HEATED SUBSTRATE SUPPORT

BACKGROUND OF THE INVENTION

1. Field of the Invention

Embodiments of the invention relate to a heated substrate support and method of fabricating the same.

2. Background of Related Art

Thin film transistors (TFTs) are conventionally made on large glass substrates or plates for use in monitors, flat panel displays, solar cells, personal digital assistants (PDAs), cell phones and the like. TFTs are made in a cluster tool by sequential deposition of various films including amorphous silicon, doped and undoped silicon oxides, silicon nitride and the like in vacuum chambers typically disposed around a central transfer chamber. Production of good quality polysilicon precursor films utilized in these structures requires that the hydrogen content of the film be controlled below about 1 percent. In order to achieve this low hydrogen content, post deposition heat treatment of the film at temperatures of about 550 degrees Celsius is required.

As the substrates utilized in TFT manufacture are large, approaching 1.5 square meter in size, preheating the substrates prior to processing is desired to maximize substrate throughput. In order to efficiently preheat the substrates, a preheating chamber is generally coupled to the transfer chamber of the cluster tool that is capable of preheating a plurality of substrates within a vacuum environment. One such preheating chamber is available from AKT, a wholly owned division of Applied Materials, Inc., located in Santa Clara, Calif.

Generally, a substrate is set on one of a plurality of heated substrate supports disposed within the preheating chamber. The substrate support is typically fabricated by vacuum brazing a heating element between two stainless steel plates. The heating element heats the substrate support to a predetermined temperature. The heating element typically comprises a resistive heater disposed on a copper plate. The good heat transfer properties of the copper plate allow the heat from the heating element to be laterally distributed resulting in uniform temperatures across the surface of the shelf supporting the substrate.

Although this conventional configuration of a heated substrate support has shown to be robust and efficient, and produces good temperature uniformity to substrate seated thereon, the vacuum brazing fabrication technique utilized to manufacture the substrate support is expensive and is available only from a limited pool of vendors.

Due to consumer demand and advances in process technology, the size of substrates utilized in the fabrication of LCD's has increased rapidly. For example, substrates over 1 meter in length per side are currently being processed while processing of substrates exceeding 1.5 meter per side is envisioned. Accordingly, the cost of manufacturing substrate supports that can handle substrates of such size utilizing conventional fabrication techniques has increased dramatically with the increase in substrate size and has further limited the pool of vendors capable of producing the substrate supports. Particularly, as substrates approach and exceed 1.2 to 1.5 meters in both length and width, the heated substrate supports fabricated using vacuum brazing techniques are becoming prohibitively expensive.

Therefore, there is a need for an improved substrate support.

SUMMARY OF THE INVENTION

A heated substrate support and method for making the same is generally provided. In one embodiment, the heated support includes a first plate and a second plate having a heating element disposed therebetween. The heating element is biased against the top plate to provide good heat transfer therewith. In another embodiment, a heated support includes a first metallic plate coupled to a second metallic plate and sandwiching at least one guide therebetween. A resistive heating element is laterally retained by the guide relative to the first plate.

In another aspect of the invention, a heating chamber for heating a substrate is provided. In one embodiment, the heating chamber includes walls defining an interior volume and a plurality of heated first support plates coupled to the walls. The first support plates are generally stacked parallel to each other within the interior volume. A heating element is urged against a side of each first support plate.

In another aspect of the invention, a method for fabricating a heated support plate is provided. In one embodiment, the method for fabricating a heated support plate includes the steps of providing a metallic first plate that has a first surface adapted to support a substrate and an opposing second surface, and a second metallic plate, forming a channel in at least one of the plates, sandwiching a resistive heater disposed in the channel between the first and second plates, and compressing the resistive heater from a non-compressed height to a compressed height equal to a depth of the channel.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
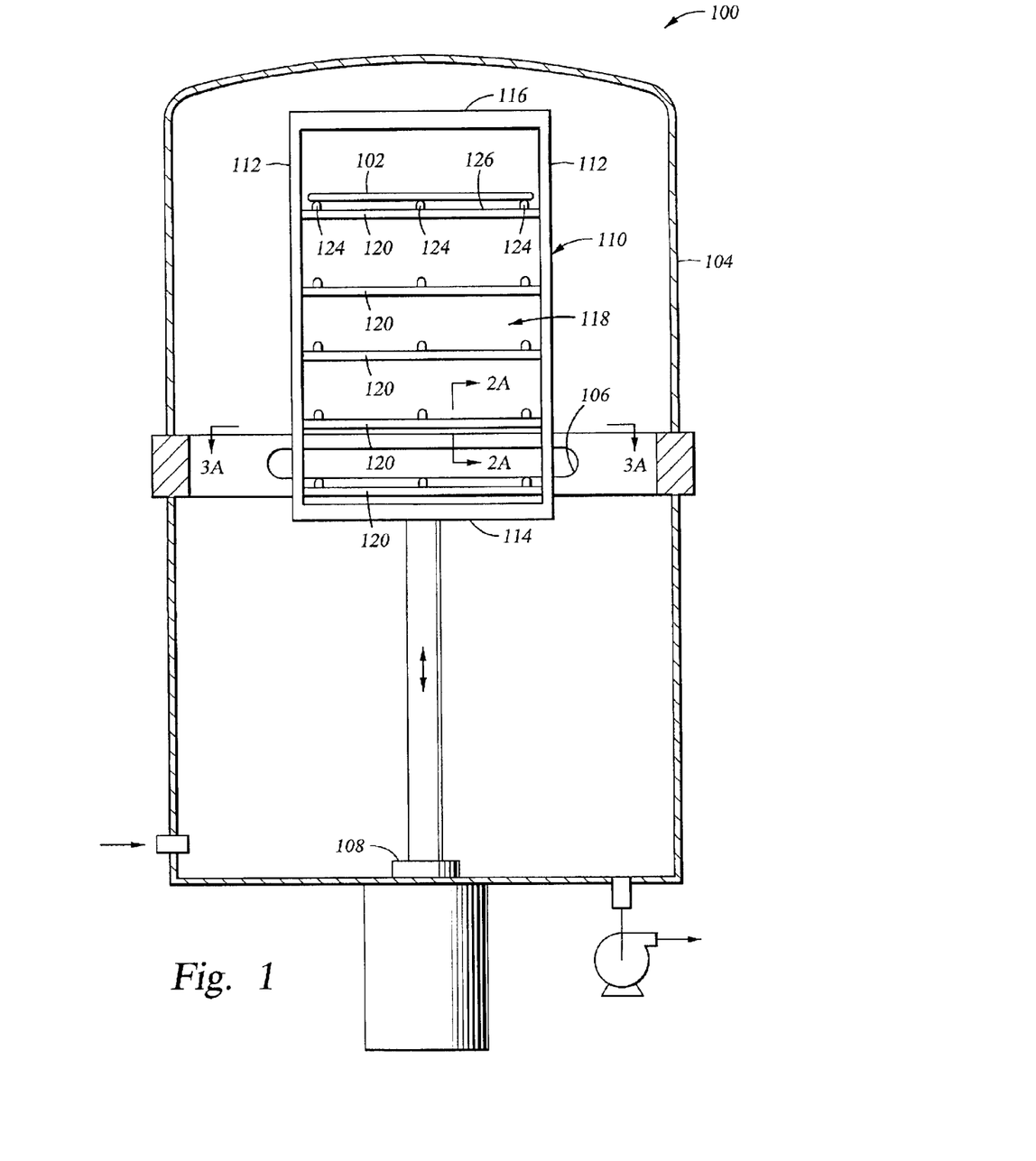
FIG. 1 is one embodiment of heated shelves for supporting a substrate illustratively disposed in a preheating chamber.

FIG. 1 depicts a preheating chamber 100 having one embodiment of a heated substrate support plate 120 disposed therein. Although the plate 120 is described as used in a preheating chamber 100, the plate 120 may also be used in other devices where heating of a substrate is desired.

The preheating chamber 100 is generally comprised chamber body 104 having a controlled environment in which a movable cassette 110 is disposed. The chamber body 104 includes at least one sealable substrate access ports 106 for facilitating entry and egress of substrates from the chamber 100.

The cassette 110 generally includes walls 112, a bottom 114 and a top 116 that define an interior volume 118. A plurality of heating plates 120 are coupled to the walls 112 of the cassette 110. Four heating plates 120 are shown in the embodiment depicted in FIG. 1, however, the cassette 110 may include any number of heating plates 120. The heating plates 120 are typically arranged in a stacked, parallel orientation within the cassette 110 so that a plurality of substrates 102 may be heated or thermally regulated while being selectively stored thereon. The bottom 114 of the cassette 110 is typically coupled to a lift mechanism 108 so that a selected plate 120 may be aligned with the port 106 to facilitate substrate transfer.

Each of the heating plates 120 has a first side 126 that faces the substrate. A plurality of spacers 124 are disposed on the first side 126 to maintain the substrate 102 in a spaced-apart relation to the plate 120. The spacers 124 may alternatively be coupled to the walls 112 of the cassette 110. The spacers 124 are generally comprised of a material and/or in a configuration that limits or eliminates scratching of the substrate 102 when moved across the spacer 124. One preheating chamber that may be adapted to benefit from the invention is described in U.S. patent Ser. No. 09/982,406, filed Oct. 17, 2001 by Hosokawa et al., which is hereby incorporated by reference in its entirety.

Figure 2A:
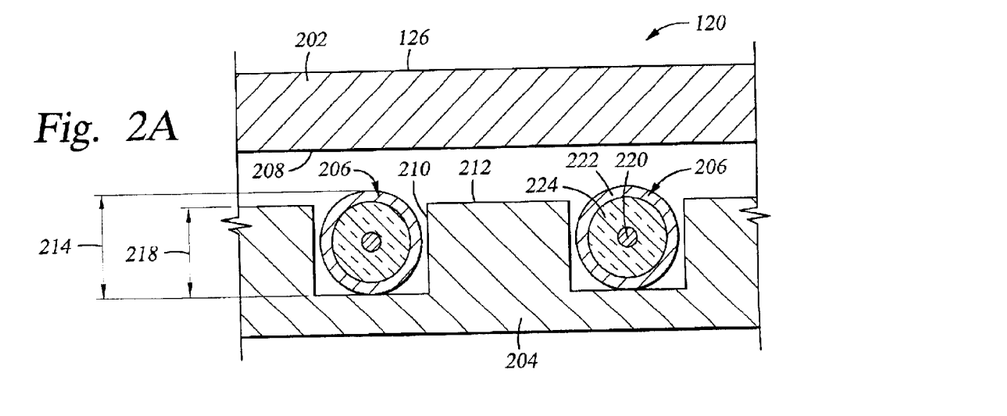
FIG. 2A is a partially exploded sectional view of the heated substrate support of FIG. 1 taken along section line 2A—2A.

FIG. 2 depicts a sectional view of one of the heating plates 120. The plate 120 generally includes a first plate 202 and a second plate 204 that are coupled together sandwiching at least one heating element 206 therebetween. The first plate 202 is generally fabricated from a material having decent thermal conduction. Preferably, the first plate 202 is fabricated from a material that does not contribute to particulate or chemical contamination of the substrate or substrate processing. For example, the first plate 202 may be fabricated from stainless steel, nickel and nickel alloys among others.

The first plate 202 has a second side 208 that opposes the first side 126 that faces the substrate. The first side 126 generally has the spacers 124 coupled thereto that support the substrate 102 as seen in FIG. 1.

The second plate 204 is generally fabricated from a thermally conductive material. Typically, the material of construction of the first plate 202 and the second plate 204 are chosen to have close coefficients of thermal expansion to minimize stresses and warping of the first side 126 of the first plate 202 at elevated temperatures. In one embodiment, both the first plate 202 and second plate 204 are fabricated from materials having the thermal expansion coefficients, for example, being fabricated from the same type of material such as stainless steel.

The resistive heating element 206 generally includes an inner conductor 220 surrounded by an outer sleeve 222. An insulator 224 is generally disposed between the conductor 220 and sleeve 222 to prevent electrical shorting. The conductor 220 is generally coupled to a power source (not shown) located external to the preheating chamber 100 and is chosen to provide adequate resistive heating of the first plate 202. The sleeve 222 is typically fabricated from a thermally conductive material. In one embodiment, the sleeve 222 is fabricated from stainless steel, nickel or nickel alloy. Optionally, the material of the sleeve 222 may be chosen to match the thermal expansion coefficients of one or both of the plates 202, 204 to further prevent possible warpage of the plate 120.

One or more channels 210 are generally provided in at least one of the plates 202, 204 to house the heating element 206. In the embodiment depicted in FIG. 2A, the channel 210 is formed in the first side 212 of second plate 204. The channel 210 is generally configured to receive the resistive heating element 206 and maintain the lateral position of the heating element 206 within a predetermined tolerance after coupling the first and second plate 202, 204.

Generally, the channel 210 is configured to provide a predefined heat distribution laterally across the plate 120. For example, the channel 210 may be formed in the second plate 204 in a predetermined configuration that retains the heating element in a position providing a predetermined temperature uniformity at the first surface 126 of the first plate 202, thereby uniformly heating the substrate. In applications where temperature uniformity at the top surface 126 of the plate 120 is not critical, wider channel spacing may be used. It should be noted that the plates 202, 204 may be configured with one or more channels 210 that may be used for one or more heating elements 206, depending on heating and fabrication requirements.

Figure 3A:
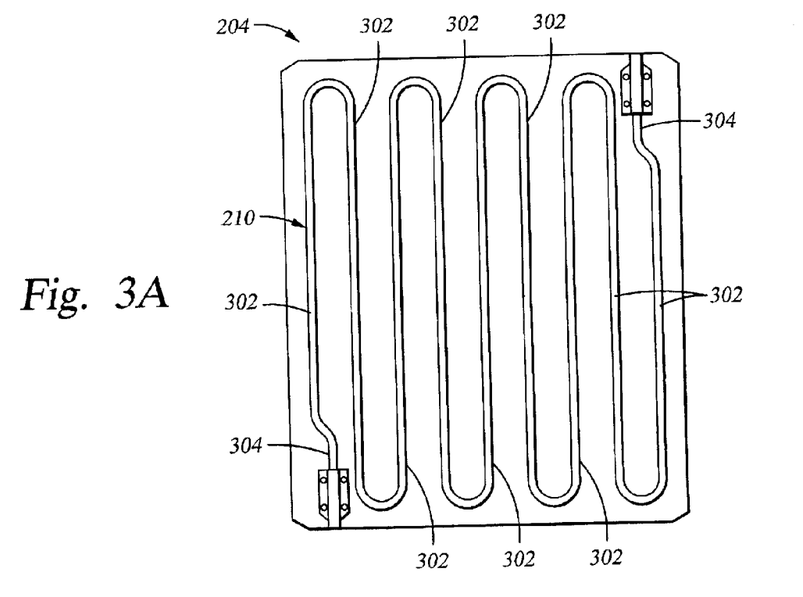
FIGS. 3A–C are sectional views of heated support plates having alternative heating element configurations.

One example of a continuous channel 210 for housing a single heating element is depicted in FIG. 3A. The channel 210 is generally arranged in a undulating pattern, having a plurality of coupled parallel runs 302 spaced to provide a determined heater density. A lead channel 304 is coupled to the outermost runs 302 to allow electrical connection of the heating element 206 to the power source. Alternative configurations are contemplated.

Figure 3B:
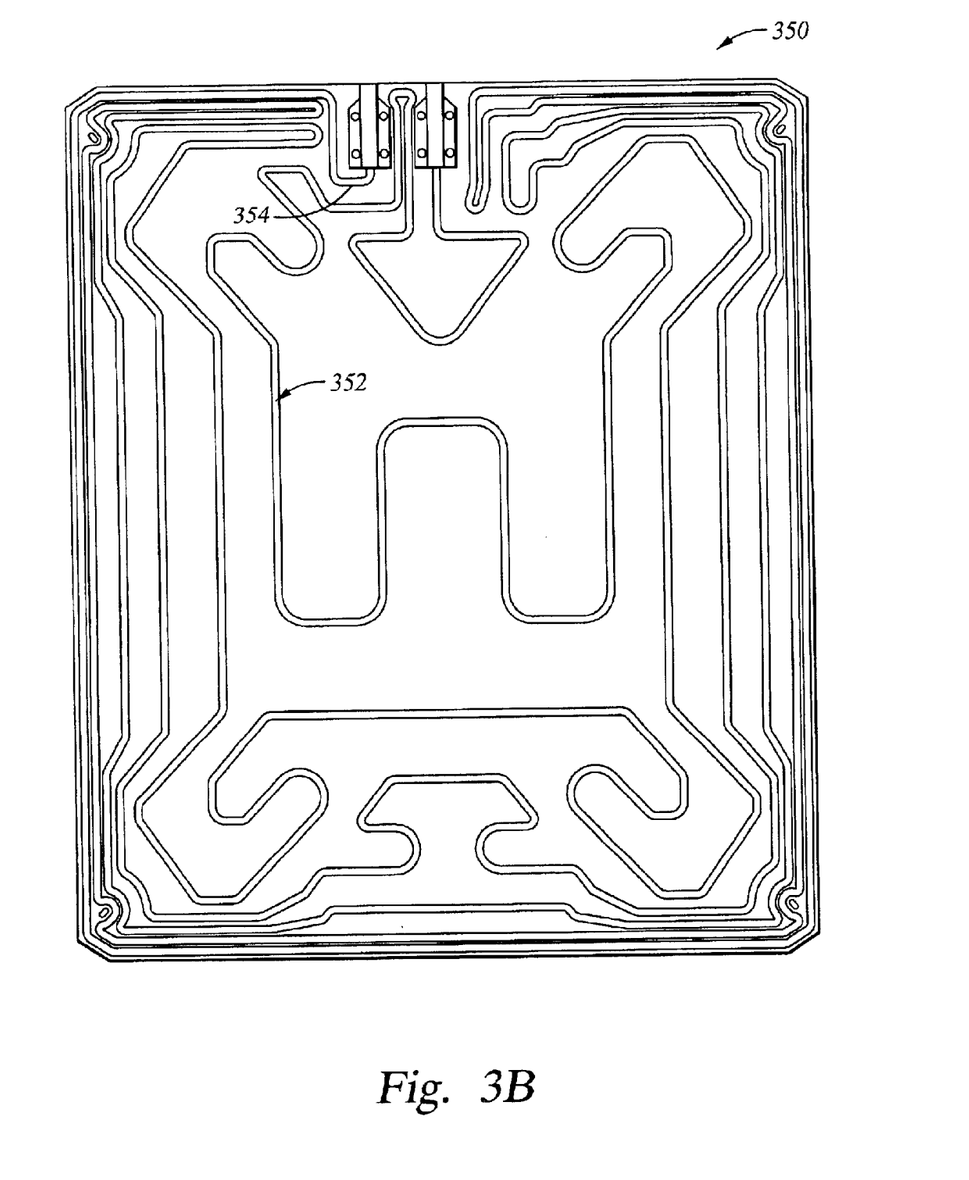

An alternative embodiment of a heating plate 350 having a continuous channel 352 is depicted in FIG. 3B. The channel 352 is generally formed in a predefined configuration to house a heating element 354. The configuration of the channel 352 may be random, spiral or other configuration that provides a desired temperature profile across the heating plate.

Figure 3C:
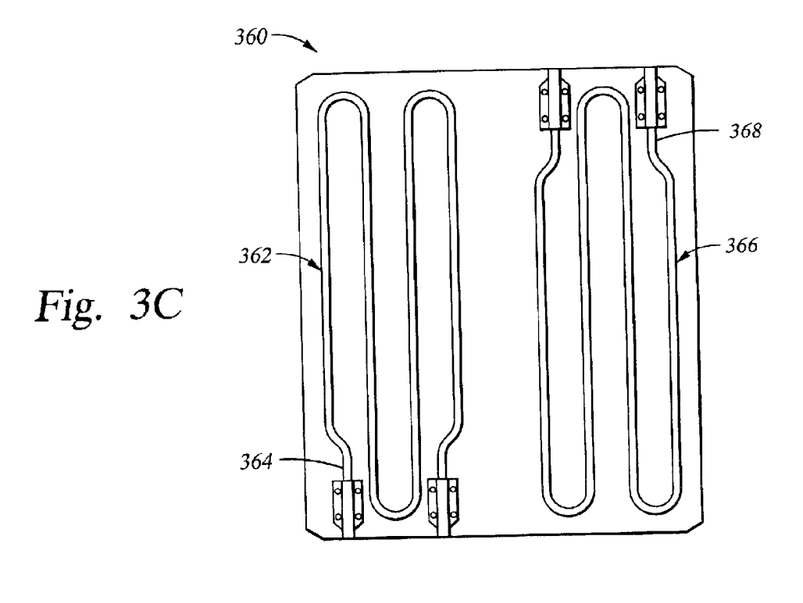

An example of a heating plate 360 having multiple channels is depicted in FIG. 3C. A first channel 362 is formed in a predefined configuration to house a first heating element 364. A second channel 366 is formed in a predefined configuration to house a second heating element 368. The heating elements 364, 368 are coupled to one or more power sources to provide power to heat the plate 360. The power provided to each heating element 364, 368 may be controlled to produce uniform temperature on the heating plate 360 or to locally heat one portion of the plate 350 more than another. Alternative configurations are contemplated.

Returning to FIG. 2A, the channel 210 generally has a depth 218 that is slightly less and a diameter or height 214 of the resistive heating element 206. As the first plate 202 is coupled to the second plate 204, the difference in the depth 218 and the height 214 results in the resistive heating element 206 being urged against both the first and second plates 202, 204 when the plates 202, 204 are coupled together. The intimate contact between the resistive heating element 206 and the plates 202, 204 results in good thermal conductivity therebetween that enhances the temperature uniformity of the first plate 202 while reducing potential hot spots along the resistive heating element 206 that could result in overheating, degradation in heating performance and heater failure. In the embodiment depicted in FIG. 2A, the channel 210 has a depth 218 resulting in about a 0.05 mm compression of the resistive heating element 206.

Figure 2B:
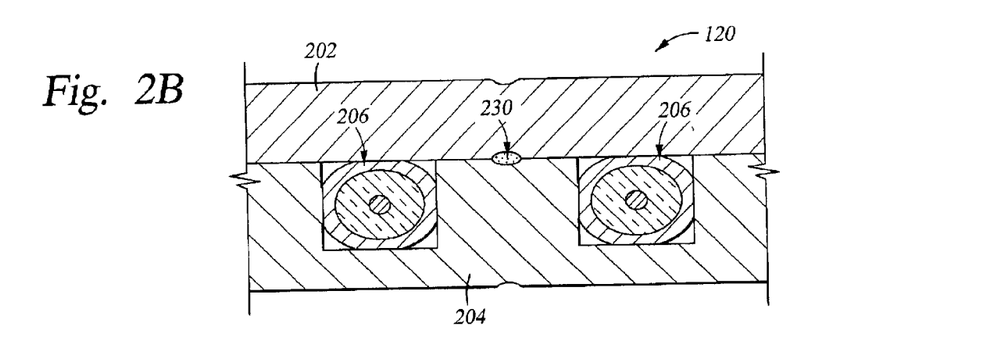
FIGS. 2B–C are sectional views of alternative fastening methods for coupling a first plate to a second plate of a heated substrate support.

The first and second plates 202, 204 comprising the plate 120 may be coupled together using a variety of methods such as clamping, fastening, bonding, brazing, welding and riveting among other joining methods. In one embodiment depicted in FIG. 2B, the plates 202, 204 are clamped to ensure intimate contact of the plates 202, 204 with the heating element 206 followed by spot welding. The spot weld (shown by reference numeral 230) directly joins the plates 202, 204 typically in a plurality of places between the heating elements 206.

Figure 2C:
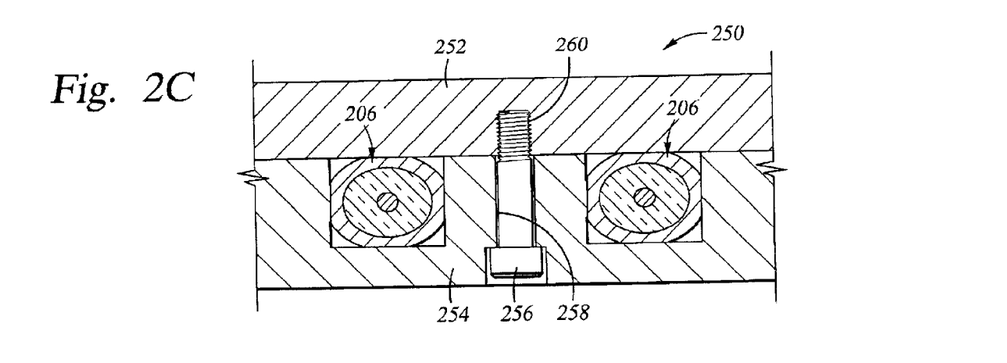

FIG. 2C depicts another embodiment of a heating plate 250 having one or more heating elements 206 sandwiched between a first plate 252 adapted to support a substrate and a second plate 254. Generally, a fastener 256, such as a socket head cap screw, is disposed between the plates 252, 254 to compress the heating elements 206 therebetween, thus ensuring good thermal exchange between the heating elements 206 and at least the first plate 252. In the embodiment depicted in FIG. 2C, the second plate 254 includes a clearance hole 258 to allow the fastener 256 to engage a threaded hole 260 formed in the first plate 252. Other joining methods are also contemplated.

Figure 4A:
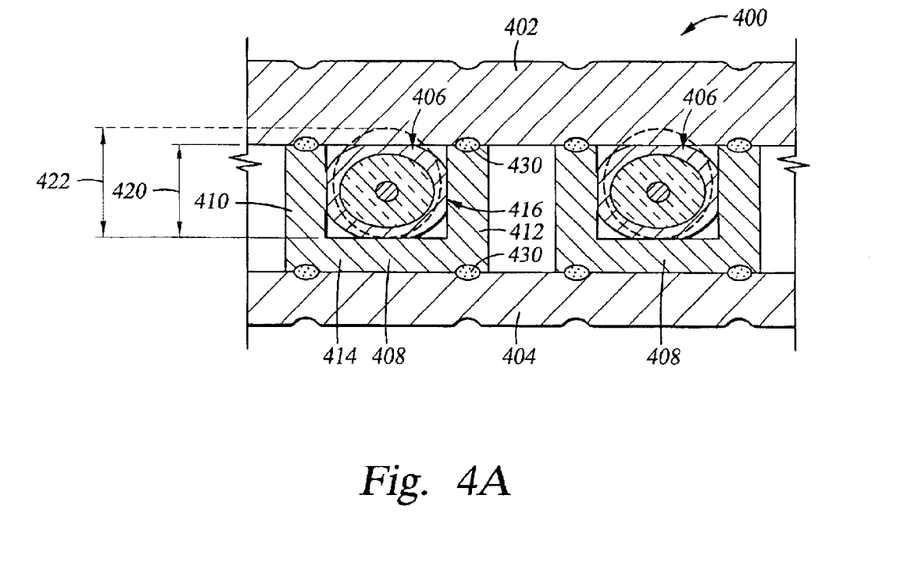
FIGS. 4A–B are partial sectional views of alternative embodiments of a heated support plate.

FIG. 4A is a partial sectional view of another embodiment of a heating plate 400. The heating plate 400 includes a first plate 402, a second plate 404, at least one heating element 406 and at least one guide 408. The plates 402, 404 are typically fabricated from a thermally conductive material, such as a metal. The heating element 406 is similar to the heating elements 206 described above and is generally sandwiched between the plates 402, 404.

The guide 408 is disposed adjacent at least a portion of the heating element 406. The guide 408 generally restrains the heating element 406 from moving laterally relative to the plates 402, 404. One or more guides 408 may be utilized for multiple heating elements 406 or for one heating element 406. The guide 408 is generally fabricated from a thermally conductive material such as stainless steel, nickel and nickel alloys among others. The guide material may be selected to match the coefficient of thermal expansion of at least one of the plates 402, 404 to limit stresses induced during heating due to differences in thermal expansion that may contribute to warpage of the plates 402, 404.

The guide 408 is generally configured to position the heating element 406 relative to the first plate 402 in a configuration that provides a predetermined temperature uniformity on the surface of the top plate 402 facing the substrate. In one embodiment, the guide 408 has a first flange 410 and a second flange 412 coupled by a center portion 414. The center portion 414 includes a heating element receiving channel 416 with a first side 418 of the second plate 404 through which the heating element 406 is routed. Generally, the number of guides 408 or a single guide 408 having a channel network is configured to position portions of the heating element 406 in a location that provides a predetermined density of the heating element 406 across the lateral plane of the heating plate 400.

The heating element receiving channel 416 generally has a depth 420 that is slightly less than a height 422 (shown in phantom) of the heating element 406. Thus, as the first plate 402 is coupled to the second plate 404, the difference in the depth 420 and the height 422 results in the heating element 406 being urged against the first plate 402 and the center portion 414 of the guide 408, thus compressing the heating element 406 between the guide 408 and the second plate 404 as shown in FIG. 4A. The intimate contact between the heating element 406, the guide 408, the first plate 402 and the second plate 404 results in good heat transfer between the heating element 406. In the embodiment depicted in FIG. 4A, the heating element receiving channel 416 has a depth 420 resulting in about a 0.05 mm compression of the heating element 406.

The first plate 402 and second plate 404 may be coupled together utilizing a variety of methods. For example, the plates 402, 404 may be coupled by clamping, fastening, bonding, brazing, welding and riveting among other joining methods. One method of coupling includes clamping the plates 402, 404 to ensure intimate contact with the heating element 406 followed by spot welding. The spot weld (shown as reference numeral 430) joins the plates 402, 404 and the flanges of the guide 408 with the weld.

Figure 4B:
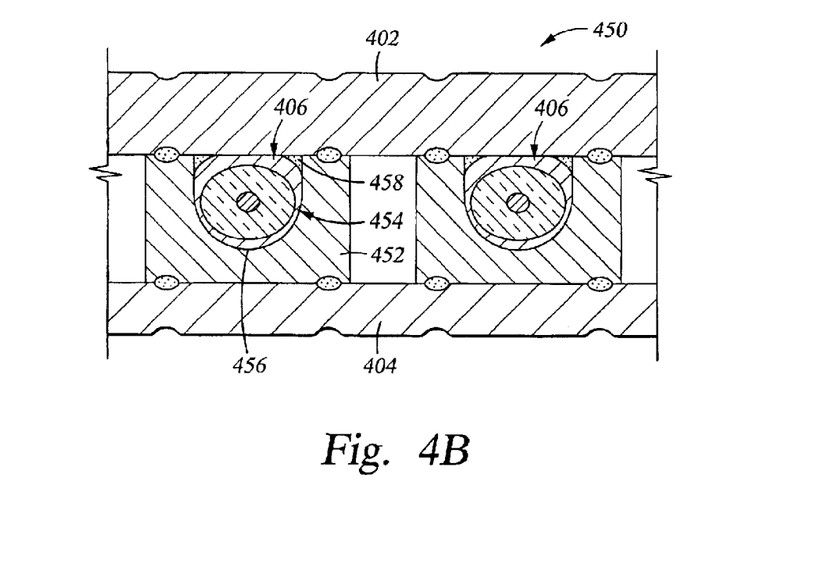

FIG. 4B is a partial sectional view of another embodiment of a heating plate 450. The heating plate 450 includes a first plate 402, a second plate 404, at least one heating element 406 and at least one guide 452. The plates 402, 404 and heating element 406 are generally similar to those described above.

The guide 452 is disposed adjacent at least a portion of the heating element 406. The guide 452 generally restrains the heating element 406 from moving laterally relative to the plates 402, 404. One or more guides 452 may be utilized for multiple heating elements 406 or for one heating element 406. The guide 452 is generally fabricated from a thermally conductive material such as stainless steel, nickel and nickel alloys among others. The guide material may be selected to match the coefficient of thermal expansion of at least one of the plates 402, 404 to limit stresses induced during heating due to differences in thermal expansion that may contribute to warpage of the plates 402, 404.

The guide 452 is generally configured to position the heating element 406 relative to the first plate 402 in a configuration that provides a predetermined temperature uniformity on the surface of the top plate 402 facing the substrate. In one embodiment, the guide 452 has a heating element receiving channel 454 through which the heating element 406 is routed. The channel 454 includes a rounded bottom 456 that increases the contact area between the guide 452 and heating element 406 when the heating element 406 is compressed between the plates 402, 404. Generally, the number of guides 452 or a single guide 452 having a channel network is configured to position portions of the heating element 406 in a location that provides a predetermined density of the heating element 406 across the lateral plane of the heating plate 450.

Optionally, a thermally conductive filler 458 may be disposed in the channel 454 between the heating element 406 and at least one of the guide 452 or plate 402. The filler 458 enhances the conduction of energy between the heating element 406 and plate 402 (and/or guide 452), thus providing more efficient heating and temperature control of the plate 402. The filler 458 may be a conductive paste, a conductive cement, a conductive adhesive, a conductive foam, a conductive gel, a metallic power, a metallic fiber, a metallic mesh, or other material that enhances the heat transfer between the heating element 406 and plate 402 that is compatible with process temperatures and does not contribute to chemical or particulate contamination of the substrate.

Figure 5A:
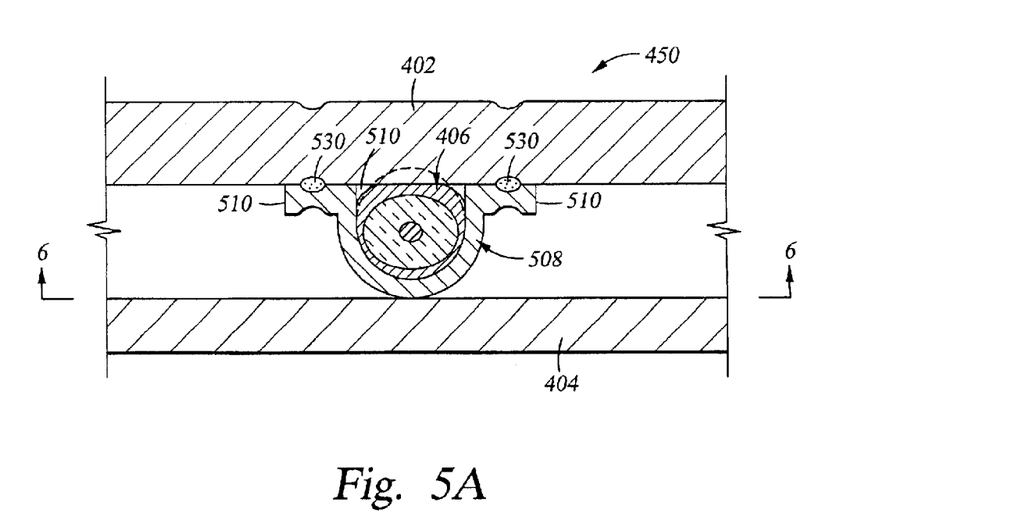
FIGS. 5A–B are partial sectional views of another embodiment of heated support plates.
Figure 5B:
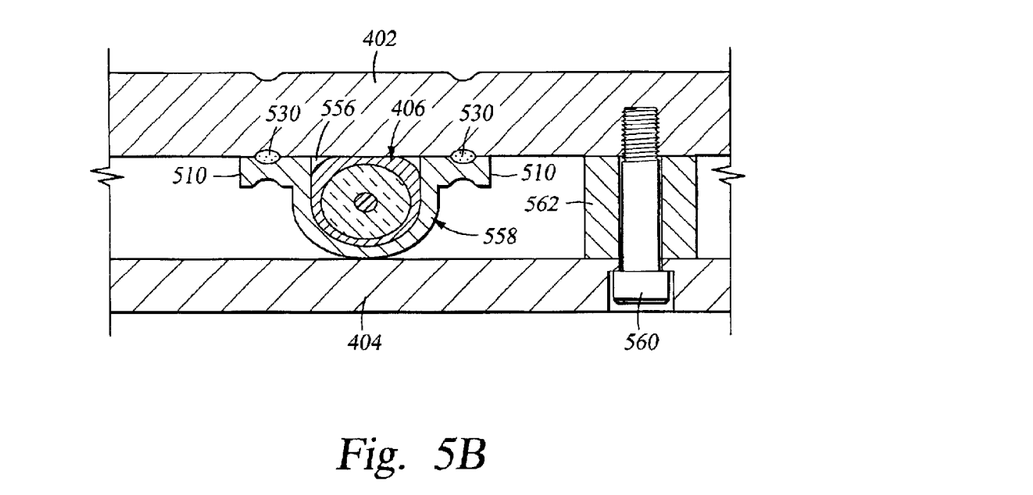

Alternatively, as depicted in FIGS. 5A and 5B, a guide 508 may be fastened to the first plate 402 prior to coupling the plates 402, 404. As shown in FIG. 5A, the guide 508 may be fastened to the first plate 402 by the same methods that could be utilized to couple the plates 402, 404, for example, spot welding flanges 510 to the first plate 402 (reference numeral 530 depicts the spot weld). A channel 516 of the guide 508 is configured to be shallower than the diameter (shown in phantom) of the heating element 406 so that the heating element 406 is urged into good thermal contact with the first plate 402 as the guide 508 is coupled to the first plate 402. The second plate 404 may then be coupled to at least one of the guides 508 or first plate 402 by variety of methods such as those discussed above.

Alternatively, as depicted in FIG. 5B, a guide 558 may be fastened to the first plate 402 by the same methods that could be utilized to couple the plates 402, 404, for example, spot welding. A channel 556 of the guide 558 is configured to retain the heating element 406 to the first plate 402. As the first and second plates 402, 404 are fastened together, for example, by a fastener 560, the heating element 406 is urged into good thermal contact with the first plate 402 as the guide 558 is compressed from an original height (shown in phantom) by the second plate 404. A positive stopping feature or element may be disposed between the first and second plates 402, 404 to ensure a predetermined compression of the heating element 406 is achieved. In the embodiment depicted in FIG. 5B, a bushing 562 is disposed around the portion of the fastener 560 extending between the plates 402, 404.

Figure 6:
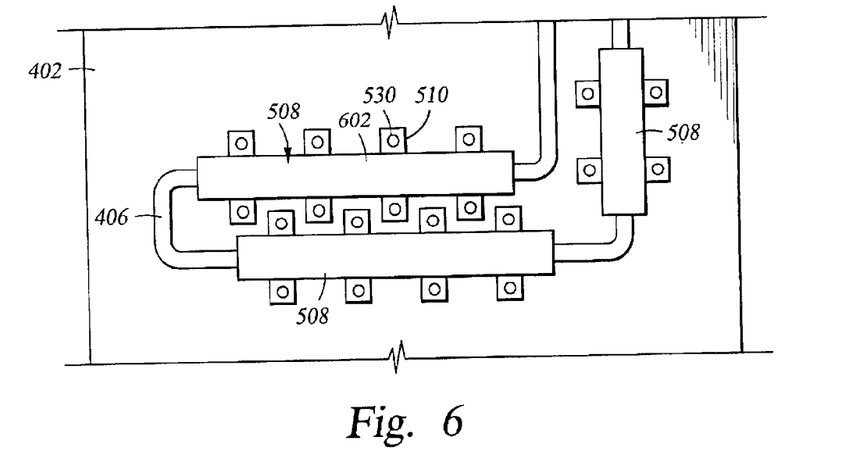
FIG. 6 is a sectional view of another embodiment of a heated support plate.

FIG. 6 is a plan sectional view of the heating plate 400 taken along section line 6—6 of FIG. 4. Generally, a plurality of guides 508 are utilized to retain the heating element in a predefined position against the first plate 402. The flanges 510 (shown as a plurality of tabs extending from a central body 602) are held by spot welds 530 to the first plate 402. The tabs 604 allow adjacent guides 508 to be nested thereby allowing greater density of the heating element 406 across the first plate 402. Alternatively, the flanges 510 may be a continuous member running along each side of the central portion 602 of the guide plate 408.

Figure 7A:
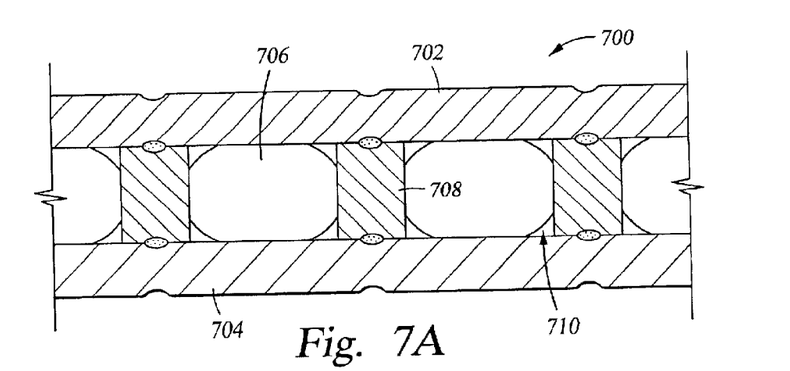
FIGS. 7A–B and 8A–B are sectional and exploded views of alternative embodiments of heated support plates.
Figure 7B:
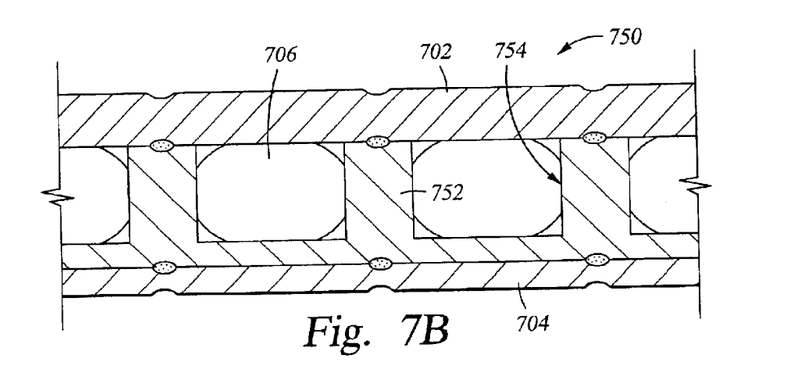
Figure 8A:
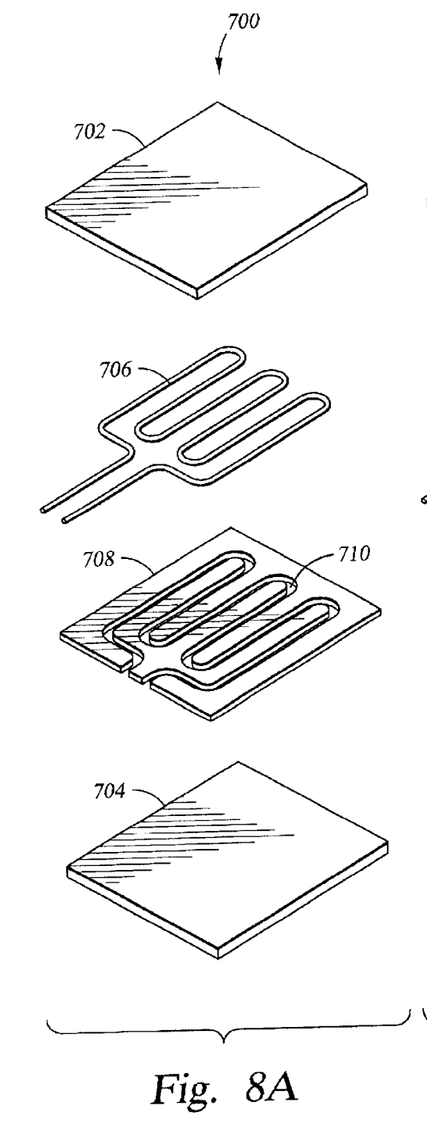

FIGS. 7A–B and 8A–B are partial sectional and exploded views of another embodiment of heated support plates 700 and 750. Referring to FIGS. 7A and 8A, the support plate 700 has a first plate 702 and a second plate 704 that sandwich a heating element 706. The first plate 702, the second plate 704 and the heating element 706 are generally similar to those described above. The heating element 706 is laterally constrained by a guide 708. The guide 708 has a continuous patterned channel 710 formed therethrough in which the heating element 706 is disposed. The channels 710 are configured to position the heating element 706 in a position that produces a predetermined temperature uniformity at the surface of the first plate 702 that faces the substrate.

The channel 710 may be formed in the guide 708 by any number of methods. For example, the channel 710 may be machined, EDM, stamped, ground or cut among other forming methods. The guide 708 generally has a thickness that defines the channel 710 at a depth that ensures that the heating element 706 is urged into good thermal contact with at least the first plate 702 when the first plate 702 and the second plate 704 are coupled together. Typically, the heating element 706 is slightly compressed by the plates 702, 704. The guide 708 may be coupled to both of the plates 702, 704 as part of a single fastening process, or may be coupled to one of the plates 702, 704 prior to coupling the plates 702, 704 to sandwich the heating element 706.

Figure 8B:
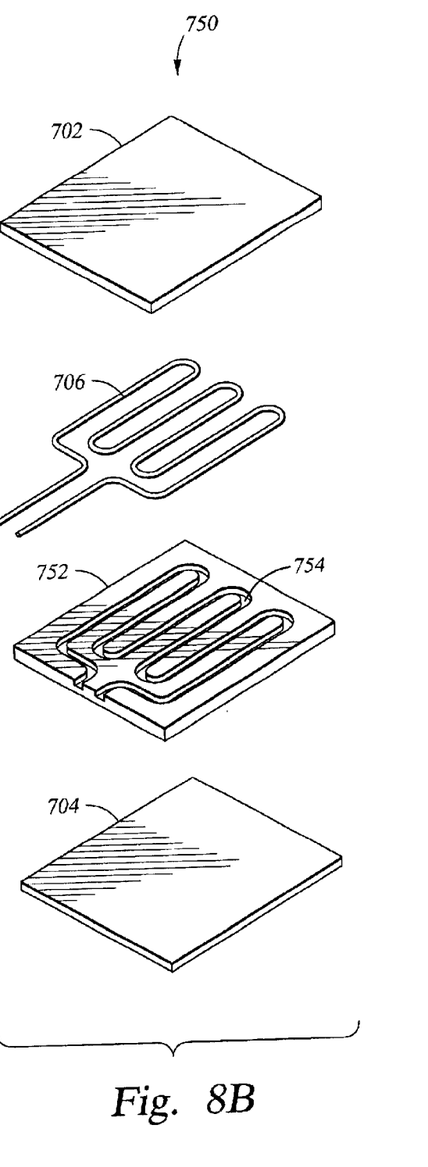

In an alternative embodiment of a heating plate 750 depicted in FIGS. 7B and 8B, a channel 754 extends partially through a guide 752 similar to the channel 416 described above with reference to FIG. 4. The guide 752 may be coupled to the plates 702, 704 directly as described above, or the guide 752 may be coupled to the first plate 702 prior to coupling the second plate 704 to the assembly of the first plate 702 and guide 752, thereby urging the heating element 706 against the first plate 702. The first plate 702 and the second plate 704 (or alternatively the guide 752) are coupled together as described above to ensure good heat transfer between the heating element 706 and the first plate 702.

Figure 9:
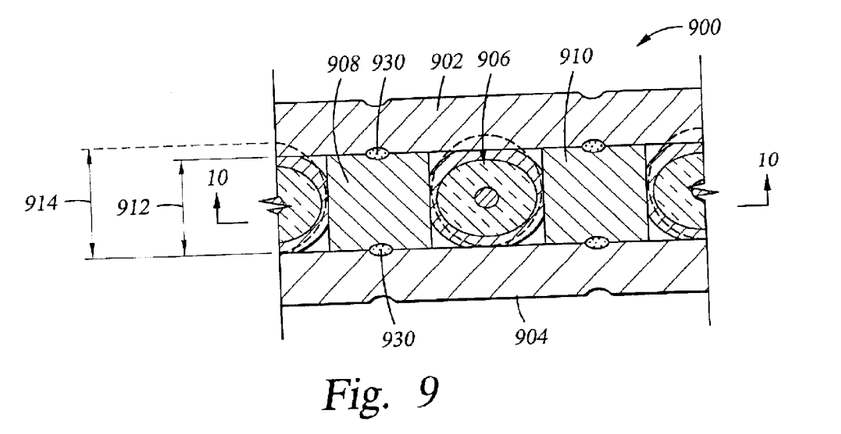
FIG. 9 is a partial sectional view of another embodiment of a heated support plate.
Figure 10:
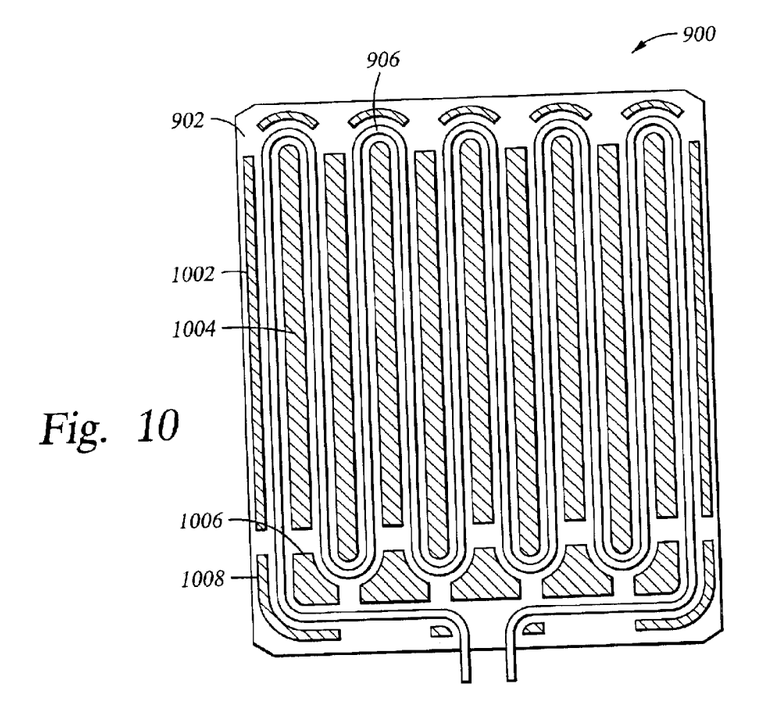
FIG. 10 is a partial sectional view of the heated support plate of FIG. 9.

FIGS. 9 and 10 are partial sectional views of another embodiment of a heated support plate 900. The support plate 900 has a first plate 902 and a second plate 904 that sandwich a heating element 906. The first plate 902, the second plate 904 and the heating element 906 are generally similar to those described above. The heating element 906 is laterally constrained by a plurality of guides. In the embodiment depicted in FIG. 10, a portion of the heating element 906 is disposed between a pair of guides 908, 910. Multiple guides may be used to secure different portions of the heating element 906 so that a predetermined spacing or heater density is maintained across the support plate 900. Additionally, one or more of the guides, for example guide 910, may bound more than one section of the heating element 906 (i.e., bounds different portions of the element 906 or different elements 906 on each side of the guide 906).

Typically, the guides 908, 910 are fabricated from a thermally conductive material, although other materials may also be utilized. In one embodiment, the material used to fabricate the guides 908, 910 is a material having a coefficient of thermal expansion similar to at least one of the plates 902, 904. The guides 908, 910 may be fabricated from flat stock and disposed between the plates 902, 910 as rectangular bars as depicted by guides 1002, 1004, or be fabricated in more complex shapes, for example, guides 1006, 1008 shown in FIG. 10.

Generally, the profile of the guides 908, 910 have a depth 912 that is slightly less than a height 914 (shown in phantom) of the heating element 906 to ensure that the heating element 906 is urged into good thermal contact when the first plate 902 and the second plate 904 are secured together. Generally, the guides 908, 910 may be coupled together using a variety of methods such as clamping, fastening, bonding, brazing, welding and riveting among other joining methods. In the embodiment depicted in FIG. 9, the plates 902, 904 and guides 908, 910 are clamped to ensure intimate contact of the plates 902, 904 with the heating element 906 followed by spot welding. The spot weld (shown by reference numeral 930) directly joins the plates 902, 904 and guides 908, 910 typically in a plurality of places between the heating elements 906. Alternatively, the guide 908 may be coupled to one of the plates 902, 904 prior to coupling the second plate 904 to the first plate 902 as described above.

While the foregoing is directed to the preferred embodiment of the present invention, other and further embodiments of the invention may be devised without departing from the basic scope thereof, and the scope thereof is determined by the claims that follow.

A heated substrate support and method for making the same is generally provided. In one embodiment, a heated support includes first and second plates having a heating element disposed therebetween. The heating element is biased against the first plate to provide good heat transfer therewith. In another embodiment, a heated support includes a first metallic plate coupled to a second metallic plate and sandwiching at least one guide therebetween. A resistive heating element is laterally retained by the guide relative to the first plate. In another aspect of the invention, a heating chamber for heating a substrate is provided. In one embodiment, the heating chamber includes walls defining an interior volume and a plurality of heated support plates coupled to the walls. The support plates are generally stacked parallel to each other within the interior volume. A heating element is urged against each first support plate.

What is claimed is:

1. A substrate support for supporting a substrate, comprising:
   a first elate having a first surface adapted to support the substrate and an opposing second surface;
   a second plate coupled to the first plate;
   a heating element disposed between the second surface of the first plate and a first surface of the second plate, the heating element urged against the first plate;
   at least one metallic guide disposed between the first and second plates, the metallic guide laterally retaining the heating element relative to the first and second plates, wherein the metallic guide further comprises:
   a first flange disposed parallel to the first surface of the second plate;
   a second flange disposed parallel to the first surface of the second plate;
   a center portion coupling the first flange to the second flange; and
   a heating element receiving channel formed in the center portion.

2. A substrate support for supporting a substrate, comprising:
   a first metallic plate having a first surface and an opposing second surface;
   a second metallic plate coupled to the first plate;
   at least one guide disposed between the second surface of the first plate and a first surface of the second plate; and
   a resistive heating element laterally retained by the guide relative to the second surface of the first plate, wherein the guide further comprises a channel formed therein facing the second surface of the first plate, the channel retaining the resistive heating element.

3. The substrate support of claim 2, wherein the channel has a depth that causes the resistive heating element to be urged against the first plate.

4. The substrate support of claim 2, wherein the channel has a rounded bottom.

5. The substrate support of claim 2, wherein the guide is coupled to the second surface of the first plate.

6. The substrate support of claim 2, wherein the guide further comprises a plurality of tabs extending from either side of a center portion, the tabs coupled to the first plate.

7. A substrate support for supporting a substrate, comprising:
   a first metallic plate having a first surface and an opposing second surface;
   a second metallic plate coupled to the first plate;
   at least one guide having a central body disposed between the second surface of the first plate and a first surface of the second plate;
   a channel formed in the central body;
   a plurality of tabs extending from the central body, the tabs coupled to the second surface of the first plate; and
   a resistive heating element disposed in the guide and urged against the second surface of the first plate.

8. The substrate support of claim 7, wherein at least one of the tabs is spot welded to the first plate.

9. The substrate support of claim 7, wherein the resistive heating element comprises a metallic sheath circumscribing an electrical conductor, the metallic sheath fabricated from material having a coefficient of thermal expansion substantially similar to a coefficient of thermal expansion of the first plate.

10. The substrate support of claim 9, wherein the metallic sheath and at least one of the first plate and the second plate are fabricated from stainless steel.

11. A method for fabricating a heated support plate comprising:
   providing a metallic first plate having a first surface adapted to support a substrate and an opposing second surface, and a second metallic plate;
   positioning at least one guide between the first and second plates, the at least one guide defining a channel parallel to a plane of the first plate;
   sandwiching a resistive heater having a height greater than a depth of the channel within the channel between the first and second plates; and
   spot welding the guide to the first plate, wherein the spot welding further comprises welding tabs extending from a body of the guide, the channel formed in the body.

* * * * *

UNITED STATES PATENT AND TRADEMARK OFFICE
CERTIFICATE OF CORRECTION

PATENT NO. : 6,897,411 B2
APPLICATION NO. : 10/074856
DATED : May 24, 2005
INVENTOR(S) : Emanuel Beer and Makoto Inagawa It is certified that error appears in the above-identified patent and that said Letters Patent is hereby corrected as shown below:

On the Title page

Item [57], Abstract, Line 3: After "includes", delete "a"

In the Specification

Column 6, Line 65: Change "power" to --powder--

Column 7, Line 41: Delete "604"

In the Claims

Column 9, Claim 1, line 20: Change "elate" to --plate--

Signed and Sealed this

Thirty-first Day of October, 2006

JON W. DUDAS
*Director of the United States Patent and Trademark Office*